(12) United States Patent
Raj et al.

(10) Patent No.: US 12,047,073 B2
(45) Date of Patent: Jul. 23, 2024

(54) POWER SUPPLY CIRCUIT WITH REDUCED LEAKAGE CURRENT

(71) Applicant: QUALCOMM Incorporated, San Diego, CA (US)

(72) Inventors: Pradeep Raj, Uttar Pradesh (IN); Rahul Sahu, Bangalore (IN); Sharad Kumar Gupta, Banagalore (IN); Chulmin Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/922,176

(22) PCT Filed: Apr. 29, 2021

(86) PCT No.: PCT/US2021/029911
§ 371 (c)(1),
(2) Date: Oct. 28, 2022

(87) PCT Pub. No.: WO2021/222579
PCT Pub. Date: Nov. 4, 2021

(65) Prior Publication Data
US 2023/0179183 A1 Jun. 8, 2023

(30) Foreign Application Priority Data
May 1, 2020 (IN) .............................. 202041018624

(51) Int. Cl.
*H03K 3/012* (2006.01)
*H03K 5/01* (2006.01)
*H03K 17/56* (2006.01)
*H03K 5/00* (2006.01)

(52) U.S. Cl.
CPC ............... *H03K 3/012* (2013.01); *H03K 5/01* (2013.01); *H03K 17/56* (2013.01); *H03K 2005/00078* (2013.01)

(58) Field of Classification Search
CPC .......... H03K 3/012; H03K 5/01; H03K 17/56; H03K 2005/00078; H03K 19/0016
See application file for complete search history.

(56) References Cited

U.S. PATENT DOCUMENTS

| | | |
|---|---|---|
| 2007/0046323 A1 | 3/2007 | Kuang et al. |
| 2011/0198941 A1* | 8/2011 | Suzuki ............... H03K 19/0016 307/116 |

(Continued)

OTHER PUBLICATIONS

International Search Report and Written Opinion—PCT/US2021/029911—ISA/EPO—Jul. 19, 2021.

*Primary Examiner* — Sibin Chen
(74) *Attorney, Agent, or Firm* — QUALCOMM Incorporated

(57) ABSTRACT

Apparatuses and methods to reduce leakage current are presented. The includes a switch circuit configured to power a circuit block; a delay circuit configured to delay enabling the switch circuit powering the circuit block and to be powered down; and a bypass circuit configured to bypass the delay circuit to disable the switch circuit powering the circuit block. The method includes powering, by switch, a circuit block; powering down a delay circuit; and bypassing, by a bypass circuit, the delay circuit to disable the switch circuit powering the circuit block.

25 Claims, 11 Drawing Sheets

(56) References Cited

U.S. PATENT DOCUMENTS

2012/0087199 A1\* 4/2012 Tejada ...................... G05F 3/02
327/544
2019/0097631 A1\* 3/2019 Lim ................... H03K 19/0008
2023/0318581 A1\* 10/2023 Kuo ....................... H03K 3/012
327/109

\* cited by examiner

POWER SUPPLY CIRCUIT WITH REDUCED LEAKAGE CURRENT

CLAIM OF PRIORITY UNDER 35 U.S.C. § 119

The present Application for Patent claims priority to a PCT Patent Application No. PCT/US2021/029911 entitled "POWER SUPPLY CIRCUIT WITH REDUCED LEAKAGE CURRENT" filed Apr. 29, 2021, which claims the benefit of Provisional First Filing of Patent Application in India, Application No. 202041018624 entitled "POWER SUPPLY CIRCUIT WITH REDUCED LEAKAGE CURRENT" filed May 1, 2020, assigned to the assignee hereof and hereby expressly incorporated by reference herein.

BACKGROUND

Field

The present disclosure relates generally to methods and apparatuses having power supply circuits with reduced leakage current and more particularly, methods and apparatuses having power supply circuits that power down delay circuits to reduce leakage current.

Background

A computing device (e.g., a laptop, a mobile phone, etc.) may include a processor on one or more semiconductor dies to perform various functions, such as telephony, internet access, camera/video function, etc. The processor may include various circuit blocks to perform those functions. These and other circuit blocks draw power while in operation. The circuit blocks may be powered by power sources, such as batteries and wall plug-ins, via power/voltage regulating circuits. For example, the power sources may generate supply voltages, and power supply circuits may be configured to provide the supply voltages to the circuit blocks.

SUMMARY

This summary identifies features of some example aspects and is not an exclusive or exhaustive description of the disclosed subject matter. Additional features and aspects are described and will become apparent to persons skilled in the art upon reading the following detailed description and viewing the drawings that form a part thereof.

An apparatus in accordance with at least one embodiment includes a switch circuit configured to power a circuit block, a delay circuit configured to delay enabling the switch circuit powering the circuit block and to be powered down and a bypass circuit configured to bypass the delay circuit to disable the switch circuit powering the circuit block.

Aspects of a method to reduce leakage current, in accordance with at least one embodiment, are presented. The method includes powering, by switch, a circuit block; powering down a delay circuit; and bypassing, by a bypass circuit, the delay circuit to disable the switch circuit powering the circuit block. Bypassing the delay circuit to disable the switch circuit powering the circuit block permits the delay circuit to be powered down. In this way, contribution of delay circuits to leakage current in the standby mode or the power-down mode can be reduced.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1:
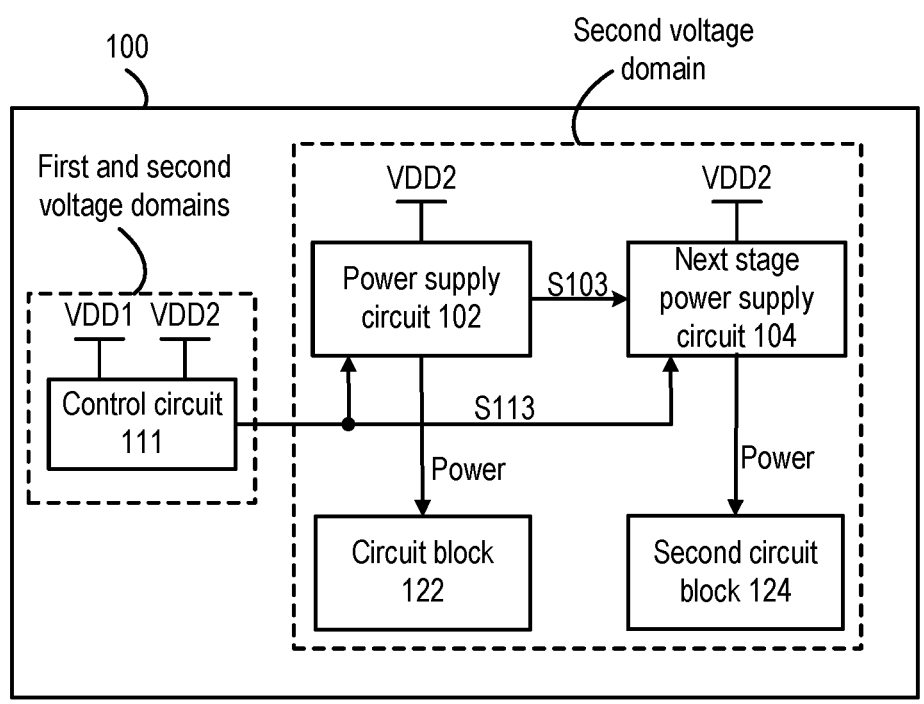
FIG. 1 illustrates an apparatus 100 having power supply circuits with reduced leakage current, in accordance with certain aspects of the disclosure.

The detailed description set forth below in connection with the appended drawings is intended as a description of various configurations and is not intended to represent the only configurations in which the concepts described herein may be practiced. The detailed description includes specific details for providing a thorough understanding of various concepts. However, it will be apparent to those skilled in the art that these concepts may be practiced without these specific details. In some instances, well known structures and components are shown in block diagram form to avoid obscuring such concepts.

As used herein, the term "coupled to" in the various tenses of the verb "couple" may mean that element A is directly connected to element B or that other elements may be connected between elements A and B (i.e., that element A is indirectly connected with element B). In the case of electrical components, the term "coupled to" may also be used herein to mean that a wire, trace, or other electrically conductive material is used to electrically connect elements A and B (and any components electrically connected therebetween). In some examples, the term "coupled to" indicate having an electric current flowing between the elements A and B. In some examples, the term "electrically connected" may indicate having an electric current flowing between the elements A and B. The term "node" may mean electrical connection, conductor, or wiring.

The terms "first," "second," "third," etc. are employed for ease of reference and may not carry substantive meanings. Examples may include a "first" control signal.

As the computing device grows in functions and shrinks in physical dimension, reducing power consumption is becoming of greater concern. For example, the computing device may enter into a standby mode, in which the computing device may power down certain circuit blocks and/or be unresponsive to certain control signals. In the standby mode, the computing device would continue to draw leakage current. For example, in the standby mode, the power circuits providing supply voltages to circuit blocks may continue to discharge leakage current, even without operations.

Moreover, the supply voltages may be powered down (e.g., to ground) in a power-down mode the reduce power consumption. The power supply circuits likewise may draw leakage current in the power-down mode. Further, powering up supply voltage networks to exit the power-down mode may cause a large inrush current to flow over the power supply circuits. Thus, the power supply circuits may include multiple parts operating in a staggered fashion. For example, the power supply circuits may include a power supply circuit and a next stage power supply circuit, each may include a delay circuit. In power up a supply voltage, the power supply circuit may start powering a circuit block first, then followed by the next stage power supply circuit powering a second circuit block, after a delay by the delay circuit. Staggering the power supply circuits in powering up of the supply voltage would reduce a peak of the inrush current, but the delay circuits may draw even more leakage current in the standby mode or the power-down mode.

Methods and apparatuses to reduce leakage in the power supply circuits (e.g., in the standby mode) are presented. For example, the delay circuits may be powered down to reduce leakage current in the standby mode or the power-down mode. In some examples, the power supply circuits may be configured to receive multiple control signals, e.g., a first control signal and a second control signal. In certain operations, the delay circuits may be powered down by either the first control signal or the second control signal.

FIG. 1 illustrates an apparatus 100 having power supply circuits with reduced leakage current, in accordance with certain aspects of the disclosure. The apparatus 100 may, for example, be one of computing system (e.g., servers, datacenters, desktop computers), mobile computing device (e.g., laptops, cell phones, vehicles, etc.), Internet of Things device, and/or virtual reality or augmented reality system. The apparatus 100 includes a power supply circuit 102 and a next stage power supply circuit 104, control circuit 111, and circuit blocks 112 and 114. The power supply circuit 102 is coupled to a supply voltage VDD2 and configured to provide power to the circuit block 122 from the supply voltage VDD2. The next stage power supply circuit 104 is coupled to a supply voltage VDD2 and configured to provide power to a second circuit block 124 from the supply voltage VDD2. The circuit blocks 122 and 124 may perform various function and may include, for example, processing units or memories.

The control circuit 111 may be configured to control functions (presented below) of the power supply circuit 102 and the next stage power supply circuit 104 via signaling S113 (e.g., via one or more electrical connections). Certain portions of the control circuit 111 may be coupled to and/or powered by the supply voltage VDD1, and other portions may be coupled to and/or powered by the supply voltage VDD2. The supply voltages VDD1 and VDD2 may be different. The certain portions of the control circuit 111 may thus operate based on the supply voltage VDD1 and may be in a first voltage domain. The power supply circuit 102 and the next stage power supply circuit 104, the circuit blocks 112 and 114, and the other portions of the control circuit 111, being powered by and/or operate based on the supply voltage VDD2, may be in a second voltage domain.

In some example, the power supply circuit 102 and the next stage power supply circuit 104 may power (e.g., restart to power) the circuit blocks 112 and 114 in a staggered fashion to, for example, exit the standby mode or the power-down mode. For example, the power supply circuit 102 may be configured to power the circuit block 122 first, then provide signaling S103 (e.g., via one or more electrical connections) to the next stage power supply circuit 104. In response to the signaling S103, the next stage power supply circuit 104 may be configured to power the circuit block 114 after a delay. In such fashion, a peak of an inrush current to exit the standby mode or the power-down mode may be reduced.

Figure 2:
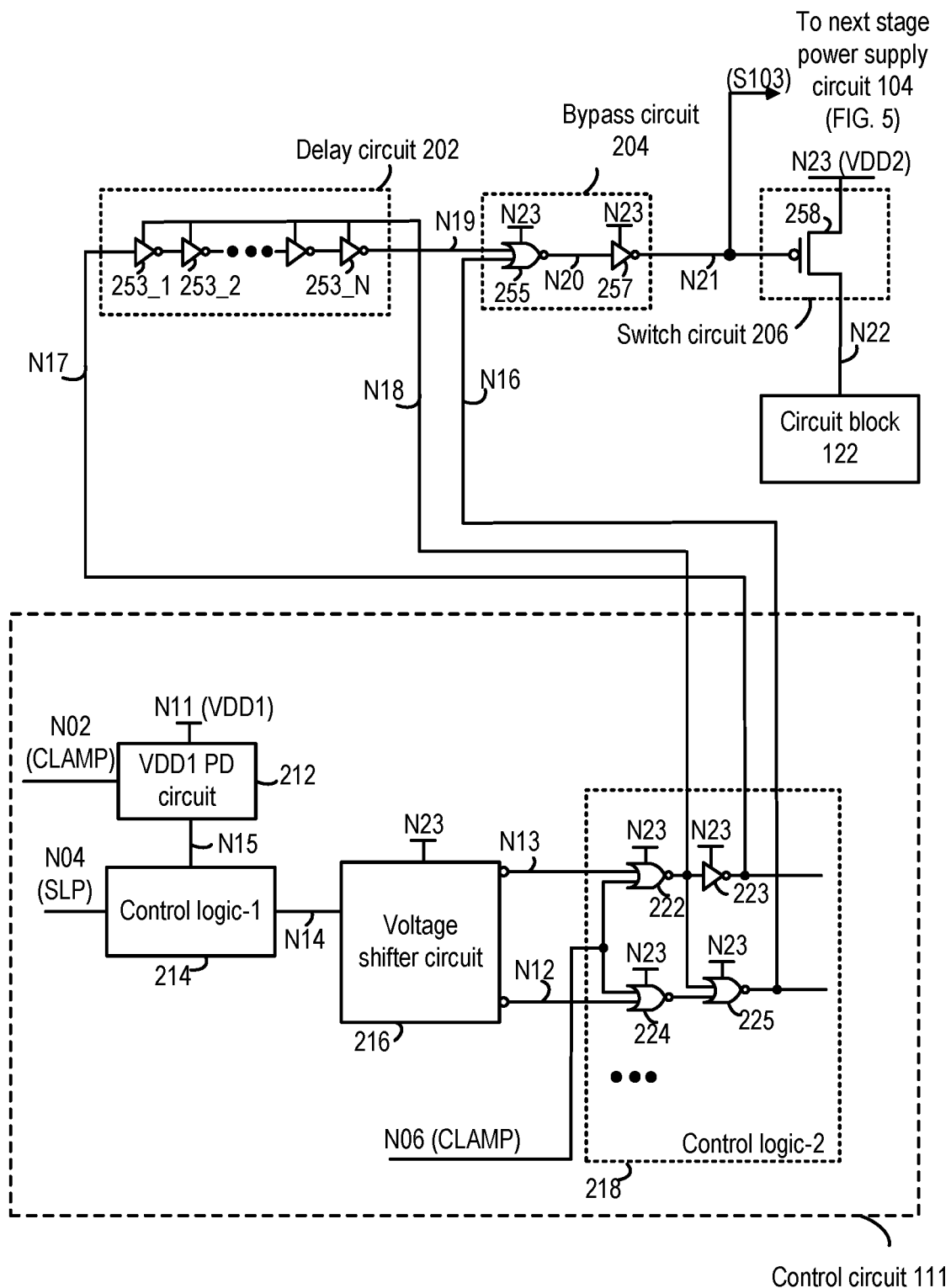
FIG. 2 illustrates example circuits of the apparatus of FIG. 1, in accordance with certain aspects of the disclosure.

FIG. 2 illustrates example circuits of the apparatus of FIG. 1, in accordance with certain aspects of the disclosure. FIG. 2 includes the power supply circuit 102, the control circuit 111, and the circuit block 122 of FIG. 1. As illustrated, the power supply circuit 102 may include a delay circuit 202, a bypass circuit 204, and/or a switch circuit 206. The control circuit 111 may include a power-down circuit 212, a control logic-1 214, a voltage shifter circuit 216, and a control logic-2 218.

The switch circuit 206 may be configured to power the circuit block 122. As illustrated, the switch circuit 206 may include a p-type transistor 258. The p-type transistor 258 may be configured to have a source coupled to a node N23 and a drain coupled to a node N22. The drain may be further coupled to the circuit block 122 via the node N22. The p-type transistor 258 may be configured to receive power via the node N23 and to power the circuit block 122 via the node N22. The p-type transistor 258 may further be configured to have a gate coupled to a node N21. The p-type transistor 258 (thus switch circuit 206) may be configured to turned ON (or OFF) to power (or to not power) the circuit block 122 based on signaling on the node N21.

The node N23 may provide a supply voltage VDD2, and the switch circuit 206 may be configured to provide the supply voltage VDD2 to the circuit block 122. Accordingly, switch circuit 206 may be configured to power the circuit block 122 in the second voltage domain. For example, the switch circuit 206 may be configured to provide power to the circuit block 122 based on the supply voltage VDD2 in the second voltage domain. In such fashion, the switch circuit 206 may be configured to operate based on the supply voltage VDD2.

The bypass circuit 204 may be configured to drive the switch circuit 206 to enable and to disable the switch circuit 206 powering the circuit block 122. The bypass circuit 204 may be further configured to drive the switch circuit 206 based on a first control signal and a second control signal (e.g., respectively a control signal SLP and a control signal CLAMP; see FIGS. 3 and 4). As illustrated, the bypass circuit 204 includes a NOR gate 255 and an inverter 257 arranged in series, via a node N20. The NOR gate 225 may be configured to receive inputs via nodes N19 and N16 (e.g., respectively first input and second input) and output via the node N20. The inverter 257 may be configured to receive input from the node N20 and output to the switch circuit 206 via the node N21. For example, the bypass circuit 204 may be configured to, via the inverter 257, drive the gate of the p-type transistor 258 of the switch circuit 206 to turn ON and OFF the p-type transistor 258, thereby to enable and to disable the switch circuit 206 powering the circuit block 122. Moreover, signaling on the node N21 (e.g., signaling S103 in FIG. 1) may be provided to the next stage power supply circuit 104 (see FIG. 1 and FIG. 5).

In some examples, the bypass circuit 204 may be in the second power domain. For example, the bypass circuit 204 (e.g., the NOR gate 255 and/or the inverter 257) may be configured to couple to and be powered via the node N23, the node N23 being configured to provide the supply voltage VDD2. Thus, the bypass circuit 204 (e.g., the NOR gate 255 and/or the inverter 257) may be configured to be powered by and/or to operate based on the supply voltage VDD2 in the second voltage domain.

The delay circuit 202 may be configured to delay signaling to the bypass circuit 204. In some examples, the delay circuit 202 delaying signaling for an intended period. In some examples, a sole or substantial purpose of the delay circuit 202 is to delay signaling. In some examples, the delayed signaling may be based on the control signal SLP. In some examples, the delay circuit 202 may be configured to delay enabling the switch circuit 206 powering the circuit block 122 and to be powered down (e.g., as instructed by the control circuit 111).

As illustrated, the delay circuit 202 may include N stages of inverters 253_1 to 253_N arranged in series. For example, an output of the inverter 253_1 may be provided as an input to the inverter 253_2, and so forth. The inverters 253_1 to 253_N may be configured to be powered via a node N18. The delay circuit 202 may be configured to receive signaling via a node N17, delay the received signaling, and output the delayed signaling to the bypass circuit 204 via the node N19. As presented with FIG. 3, the signaling on the node N17 may be based on the control signal SLP.

In some examples, the delay circuit 202 may be in the second power domain. For example, the delay circuit 202 (e.g., the N stages of inverters 253_1 to 253_N) may be configured to couple to and be powered via the node N23, the node N23 being configured to provide the supply voltage VDD2 (see presentation below with the control circuit 111). Thus, the delay circuit 202 (e.g., the N stages of inverters 253_1 to 253_N) may be configured to be powered by and to operate based on the supply voltage VDD2 in the second voltage domain. See presentation relating to the control circuit 111 below.

As presented above, the bypass circuit 204 may be configured to bypass the delay circuit 202 to disable the switch circuit 206 powering the circuit block 122. The bypass circuit may include a first input (e.g., the node N19) and a second input (e.g., the node N16). The delay circuit 202 may be configured to delay enabling the switch circuit 206 powering the circuit block 122 via the first input (e.g., the node N19). The bypass circuit 204 may be further configured to, based on signaling received via the second input (e.g., the node N16), bypass the delay circuit 202 to disable the switch circuit 206 powering the circuit block 122. In some examples, the bypass circuit 204 may include a gate, such as the NOR gate 255, coupled to the first input (e.g., the node N19) and the second input (e.g., the node N16).

The control circuit 111 may be configured to, based on the control signal SLP (e.g., the first control signal) and via the delay circuit 202 and the bypass circuit 204, enable and disable the power supply circuit 102 powering the circuit block 122. The control signal SLP may be in a voltage domain of the supply voltage VDD1 (e.g., the first voltage domain) and may be in a state of logic one or a state of logic zero. The control circuit 111 may be further configured to, based on the control signal CLAMP (e.g., the second control signal), cause the bypass circuit 204 to drive the switch circuit 206 to disable the switch circuit 206 powering the circuit block 122, bypassing the delay circuit 202. The second control signal CLAMP may be in a voltage domain of the supply voltage VDD2 (e.g., the second voltage domain) and may be in a state of logic one or a state of logic zero.

The power-down circuit 212 may be coupled to and powered via a node N11 and configured to receive an input via a node N02. The node N11 may be configured to provide the supply voltage VDD1. The power-down circuit 212 may be configured to provide power to the control logic-1 214 via a node N15 and be further configured to power down the control logic-1 214, based on the control signal CLAMP received via the node N02. For example, the power-down circuit 212 may be configured to provide power from the node N11 to the control logic-1 214, via the node N15, in response to the CLAMP signal being in a first state (e.g., logic one). The power-down circuit 212 may be further configured to stop powering (e.g., to power down) the control logic-1 214, via the node N15, in response to the CLAMP signal being in a second state (e.g., logic zero). In some example, the power-down circuit 212 may include a p-type transistor (not shown) having a source coupled to the node N11, a drain coupled to the node N15, and a gate coupled to the node N02.

The control logic-1 214 may be configured to receive the control signal SLP via a node N04 and to output a state of the SLP signal to the voltage shifter circuit 216 via a node N14. The control logic-1 214 may be configured to be powered via the node N15 to implement various functions (such as those present below) to control the power supply circuit 102. For example, the control logic-1 214 may be configured to a state of the SLP signal to the voltage shifter circuit 216 via the node N14. For example, the control logic-1 214 may be configured output a logic zero to the voltage shifter circuit 216 via the node N14, in response to SLP signal being in a logic zero state.

In some examples, the node N11 may be configured to provide a supply voltage VDD1, different from the supply voltage VDD2. Since the power-down circuit 212 and the control logic-1 214 operate based on and/or being powered by the supply voltage VDD1, the power-down circuit 212 and the control logic-1 214 may be in a first voltage domain. In some examples, the SLP signal may be in the first voltage domain. Circuits and signals operate based on and/or being powered by the supply voltage VDD2 may be in a second voltage domain. The CLAMP signal may be in the second voltage domain.

The voltage shifter circuit 216 may be configured to convert signaling in the first voltage domain (e.g., received from the node N14) into signaling in the second voltage domain (outputted to nodes N12 and N13). In some examples, signaling at the node N12 or the node N13 may be an inverted state of an input at the node N14. The voltage shifter circuit 216 may be further configured to output the signaling in the second voltage domain to the control logic-2 218 via the nodes N12 and N13. The control logic-2 218 may be configured to receive input on nodes N12, N13 and the CLAMP signal on a node N06. The control logic-2 218 may be further configured to output various signals on nodes N16, N17, and N18 to cause the power supply circuit 102 to operate. In such fashion, the control circuit 111 may be configured to provide signaling to the second input (e.g., the node N16) via the voltage shifter circuit 216. In some examples, the control logic-2 218 may be configured to receive and to be powered by the supply voltage VDD2 via the node N23. The control logic-2 218, being powered by and/or operate based on the supply voltage VDD2, may thus be in the second voltage domain.

The control circuit 111 may be configured to, based on the control signal SLP (may be referred to as first control signal) and via the delay circuit 202 and the bypass circuit 204, enable and disable the switch circuit 206 powering the circuit block 122. The control circuit 111 may be further configured to power down the delay circuit 202 and to cause the bypass circuit 204 to drive the switch circuit 206 to disable the switch circuit 206 powering the circuit block 122, in response to a state of the control signal CLAMP (may be referred to as second control signal) and independent of the control signal SLP. The control circuit 111 may be further configured to allow the bypass circuit 204 to drive the switch circuit 206 to enable and to disable the switch circuit 206 powering the circuit block 122, based on the control signal SLP and via the delay circuit 202, in response to a second state of the control signal CLAMP. These and other functions and operations of the control circuit 111 are presented with FIG. 3.

Figure 3:
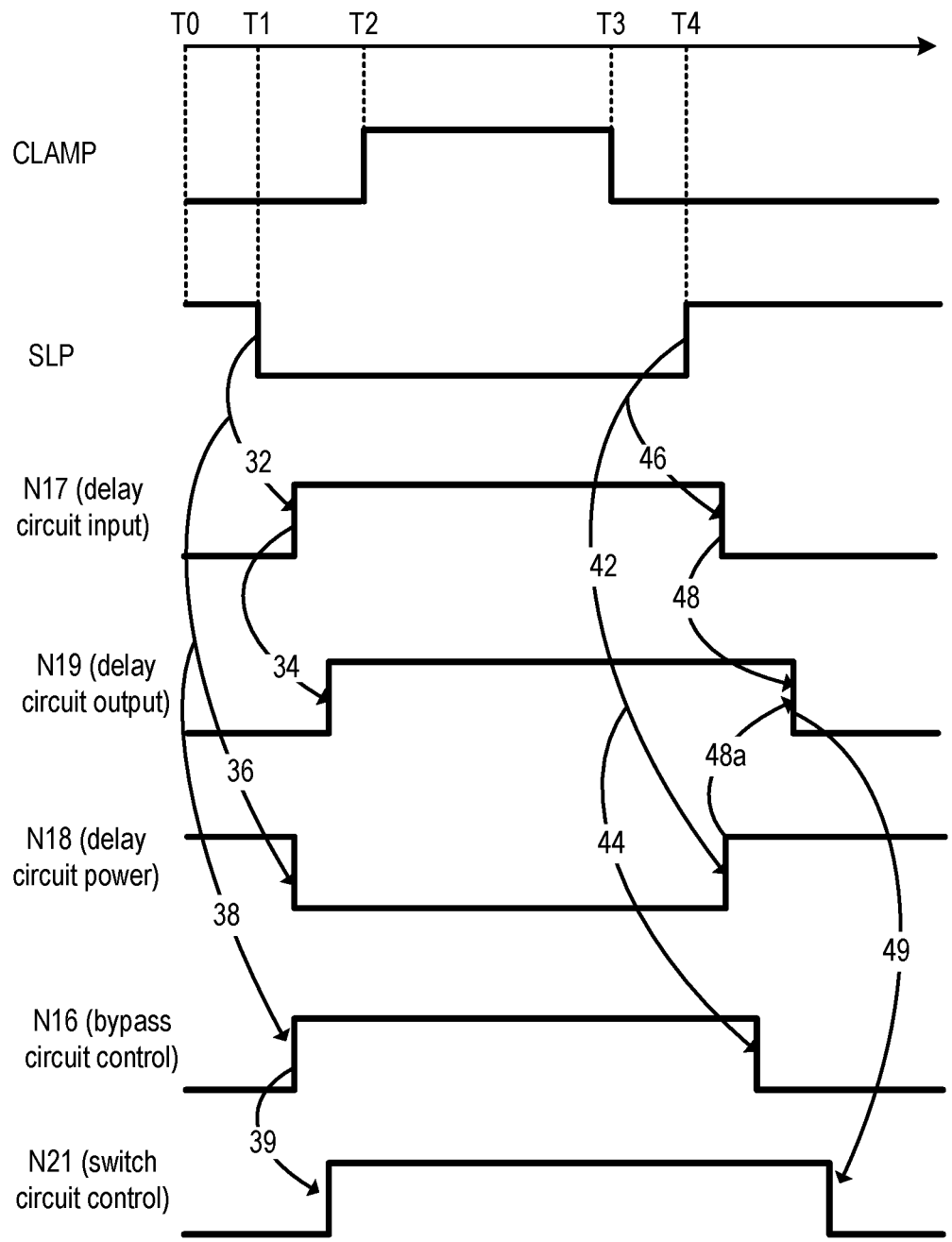
FIG. 3 illustrates example operations of the apparatus of FIG. 1, in accordance with certain aspects of the disclosure.

FIG. 3 illustrates example operations of the apparatus 100 of FIG. 1, in accordance with certain aspects of the disclosure. In FIG. 3, the node N17 is labeled with "delay circuit input;" the node N19 is labeled with "delay circuit output;" the node N18 is labeled with "delay circuit power;" the node N16 is labeled with "bypass circuit control;" and the node N21 is labeled with "switch circuit control" for reference.

In FIG. 3, the supply voltages VDD1 and VDD2 are both ON and at their respective supply voltage levels. The control signal SLP (may be referred to as a first control signal and may be in the first voltage domain) and the control signal CLAMP (may be referred to as a second control signal and may be in the second voltage domain) toggle and trigger operations to reduce current leakage in the power supply circuit 102 (FIG. 2). At T0, the control signal CLAMP is at logic zero (e.g., ground), a state that does not turn off the delay circuit 202 and the bypass circuit 204 (FIG. 2). Further, at T0, the control signal SLP is at logic one (e.g., at VDD1), a state that does not turn off the delay circuit 202 and the bypass circuit 204. Accordingly, the input to the switch circuit 206 (FIG. 2) is at logic zero, and the switch circuit 206 is ON and powers the circuit block 122.

At T1, the control signal SLP transitions to logic zero (e.g., ground). As presented below, the control circuit 111, based on the control signal SLP transitioning to logic zero and via the delay circuit 202 and the bypass circuit 204, disables the switch circuit 206 powering the circuit block 122. At 32, an input to the delay circuit 202 at node N17 transitions to logic one, in response to the control signal SLP transitioning to logic zero. Referring to FIG. 2, the control logic-1 214 outputs at N14 logic zero, in response to the control signal SLP transitioning to logic zero. The voltage shifter circuit 216, based on the signaling at N14, outputs logic one at the node N12. The control logic-2 218 outputs logic one at N17 via a NOR gate 222 and an inverter 223, in response to the node N13 transitioning to logic one.

At 34, the delay circuit 202 outputs at the node N19 logic one following the input to the delay circuit 202 at node N17 transitions to logic one, after a delay through the delay circuit 202. At 36, in response to the control signal SLP transitioning to logic zero (the node N14 becomes logic zero and the node N13 becomes logic one), the control logic-1 214 outputs logic zero at a node N18 via a NOR gate 222 to power down the delay circuit 202. For example, power (e.g., supply voltage VDD2 via the NOR gate 222 of the control logic-2 218) provided to one or more stages (e.g., among inverters 253_1 to 253_N) in the delay circuit 202 is disabled by setting the node N18 to logic zero. In such fashion, reduce leakage current of the delay circuit 202 in a standby state is reduced. In such fashion, the control circuit 111 powers down the delay circuit 202 in response to the control signal SLP being logic zero.

At 38, in response to the control signal SLP transitioning to logic zero (the node N14 becomes logic zero and the node N12 becomes logic one), the control logic-1 214 outputs logic one (e.g., at supply voltage VDD2) at a node N16 via NOR gates 224 and 225. At 39, in response to the node N16 becomes logic one, the bypass circuit 204 outputs logic one at the node N21 to the switch circuit 206, turning off the p-type transistor 258 powering the circuit block 122. In such fashion, the control circuit 111, based on the control signal SLP (may be referred to as first control signal) and the control signal CLAMP being de-asserted, may be configured to provide signaling on the node N16 to bypass the delay circuit 202 and to disable the switch circuit 206 powering the circuit block 122. Further, the control circuit 111, based on the control signal SLP and the control signal CLAMP being de-asserted, may be configured to power down the delay circuit 202.

As presented above, the control circuit 111 may be configured to, based on a first control signal (e.g., the control signal SLP), provide the signaling to the second input (e.g., the node N16) to bypass the delay circuit 202 to disable the switch circuit 206 powering the circuit block 122. For example, the control circuit 111 providing logic one on the node N16 would disable the switch circuit 206 powering the circuit block 122, independent of actions of the delay circuit 202. Further, the control circuit 111 may be further configured to, via the voltage shifter circuit 216, power down the delay circuit 202 based on the control signal SLP.

At T2, the control signal CLAMP is asserted to effect functions presented herein (transitions to logic one). In response, the VDD1 power-down circuit 212 of the control circuit 111 powers down the control logic-1 circuit 214. For example, the VDD1 power-down circuit 212 may turn off the supply voltage VDD1 provided to the control logic-1 214 via the node N15. As a result, a leakage current of the control circuit 111 may be further reduced in a standby mode (e.g., a mode that the control circuit 111 is not in operation and/or not responsive to certain control signal transitions). This and other functions of the control signal CLAMP are presented further with FIG. 4. At T3, the control signal CLAMP transitions to logic zero (de-asserted), and in response, the VDD1 power-down circuit 212 powers up the control logic-1 214. For example, the VDD1 power-down circuit 212 provides the supply voltage VDD1 via the node N15, allowing the control logic-1 214 to operate and/or to respond to the control signal SLP.

At T4, the control signal SLP transitions to logic one (e.g., supply voltage VDD1). As presented below, the control circuit 111, based on the control signal SLP transitioning to logic one (e.g., the supply voltage VDD1) and via the delay circuit 202 and the bypass circuit 204, enables the switch circuit 206 powering the circuit block 122. At 42, the node N18, via which power (e.g., supply voltage VDD2) is provided to the delay circuit 202, transitions to logic one to power up the delay circuit 202. For example, in response to the control signal SLP transitioning to logic one, the control logic-1 214 output logic one onto the node N14, and the voltage shifter circuit 216 outputs logic zero on the node N12. The control logic-2 218 outputs logic one via the NOR gate 222.

At 44, the node N16, a control of the bypass circuit 204, transitions to logic zero to enable the bypass circuit 204 (e.g., the bypass circuit 204 would operate based on the node N19 with the node N16 at logic zero). For example, the control logic-2 218 outputs logic zero at the node N16 via the NOR gates 224 and 225. In some examples, the control circuit 111, via the voltage shifter circuit 216 and the control logic-2 218, may delay output N16 to logic zero, after the node N18 is powered up to ensure that the node N19 follows the node N17. In such fashion, a possibility of a false state on the node N19 is removed.

At 46, the node N17, input to the delay circuit 202, transitions to logic zero. For example, the control logic-1 214 outputs logic one at the node N14 and the voltage shifter circuit 216 outputs logic zero at the node N13, in response to the control signal SLP transitioning to logic one. The control logic-2 218 outputs logic zero at the node N17 via the NOR gate 222 and the inverter 223. At 48*a*, the delay circuit 202 is powered up via the node N18. At 48, the node N19, output of the delay circuit 202, transitions to logic zero following a delay via the delay circuit 202. At 49, the node N21 transitions to logic zero in response to the node N19 transitioning to logic zero. For example, the bypass circuit 204 outputs logic zero on the node N21 via the NOR gate 255 and the inverter 257, based on the node N19, to turn on the switch circuit 206 powering the circuit block 122. In such fashion, the switch circuit 206 is enabled to power the circuit block 122, by control circuit 111 via the delay circuit 202 and the bypass circuit 204, based on the control signal SLP (e.g., when the control signal CLAMP is not asserted). Moreover, the logic zero at the node N21 may be provided to the next stage power supply circuit 104 (e.g., FIG. 1 and FIG. 5) as signaling S103.

Figure 4:
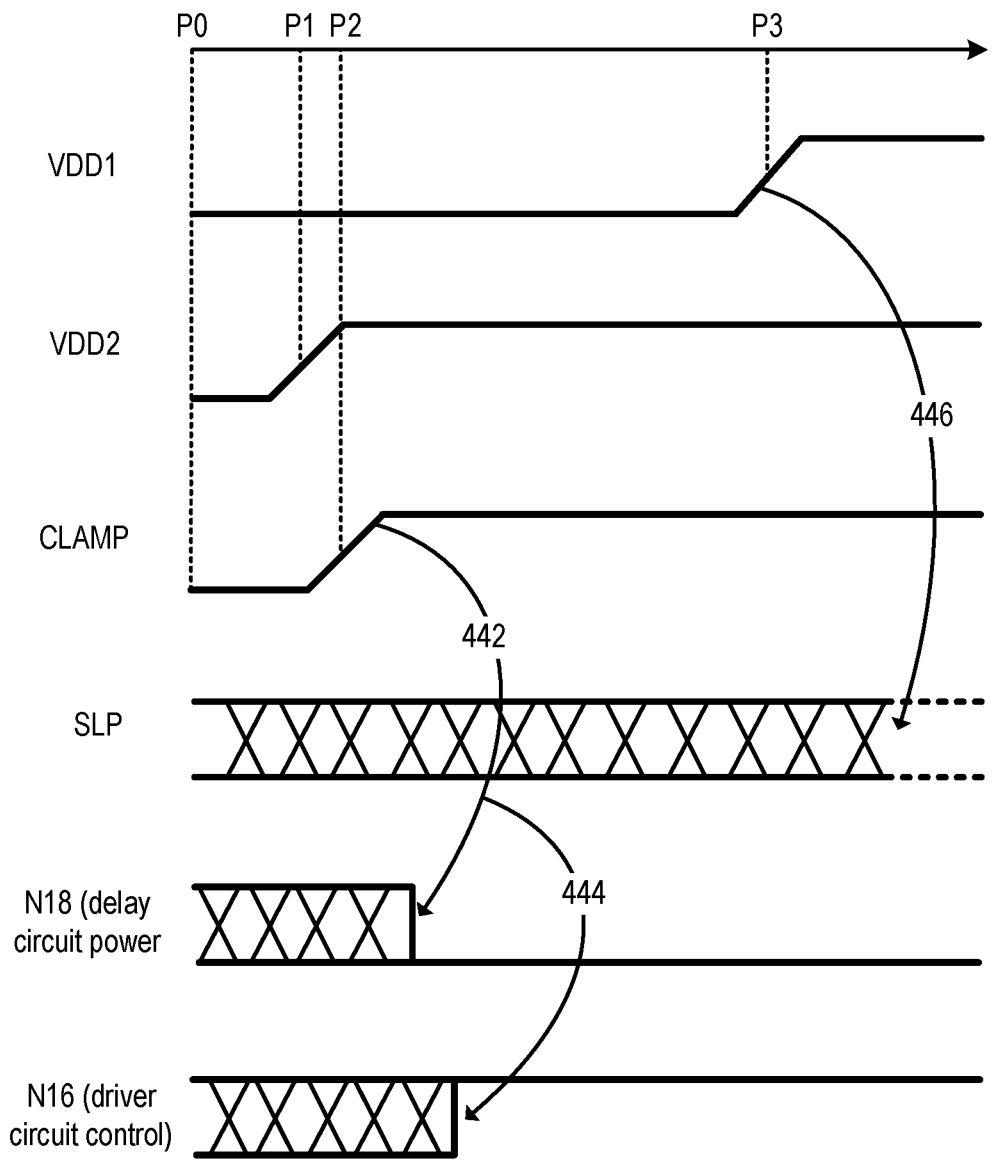
FIG. 4 illustrates example operations of the apparatus 100 of FIG. 1 during powering up of supply voltages, in accordance with certain aspects of the disclosure.

FIG. 4 illustrates example operations of the apparatus 100 of FIG. 1 during powering up of supply voltages, in accordance with certain aspects of the disclosure. In FIG. 4, the node N18 is labeled with "delay circuit power" and the node N16 is labeled with "bypass circuit control" for ease of reference. In some examples, the apparatus 100 powers down the delay circuit 202 to reduce leakage current during powering up of supply voltages VDD1 and VDD2. At P0, the supply voltages VDD1 and VDD2 are at ground. At P1, the supply voltage VDD2 powers up, while the supply voltage VDD1 remains at ground. At P2, the control signal CLAMP follows the supply voltage VDD2 and rises to the supply voltage VDD2.

As an example, the control signal CLAMP is asserted in response to powering up the supply voltage VDD2 to effect at least some of functions presented below. For example, the control signal CLAMP may be asserted to power down the delay circuit 202 and/or to disable the switch circuit 206 powering the circuit block 122. At 442, in response to the control signal CLAMP being asserted (e.g., transitions to logic one), the node N18 goes to logic zero (e.g., ground). For example, in response to the control signal CLAMP being logic one, the control logic-2 outputs logic zero on the node N18 via the NOR gate 222, independent of the control signal SLP. FIG. 4 illustrates that control signal SLP being in an undetermined state, having no bearing on the control circuit 111 powering down the node N18 (and therefor, powering down the delay circuit 202). In such fashion, the control circuit 111 powers down the delay circuit 202, in response the logic one state of the control signal CLAMP independent of the control signal SLP.

At 444, in response to the control signal CLAMP being asserted (e.g., transitions to logic one), the node N16 goes to logic one to cause the bypass circuit 204 to disable the switch circuit 206 powering the circuit block 122. For example, referring to FIG. 2, the control logic-2 outputs logic one on the node N16 via the gates 224 and 225, in response to the control signal CLAMP being asserted. In such fashion, the control circuit 111 may be configured to provide the signaling to the node N16 to bypass the delay circuit 202 to disable the switch circuit 206 powering the circuit block 122, in response to the control signal CLAMP being asserted and independent of the control signal SLP. At P3, the supply voltage VDD1 is powered up. At 446, the control signal SLP is ready to be powered up after the supply voltage VDD1 is powered up.

Figure 5:
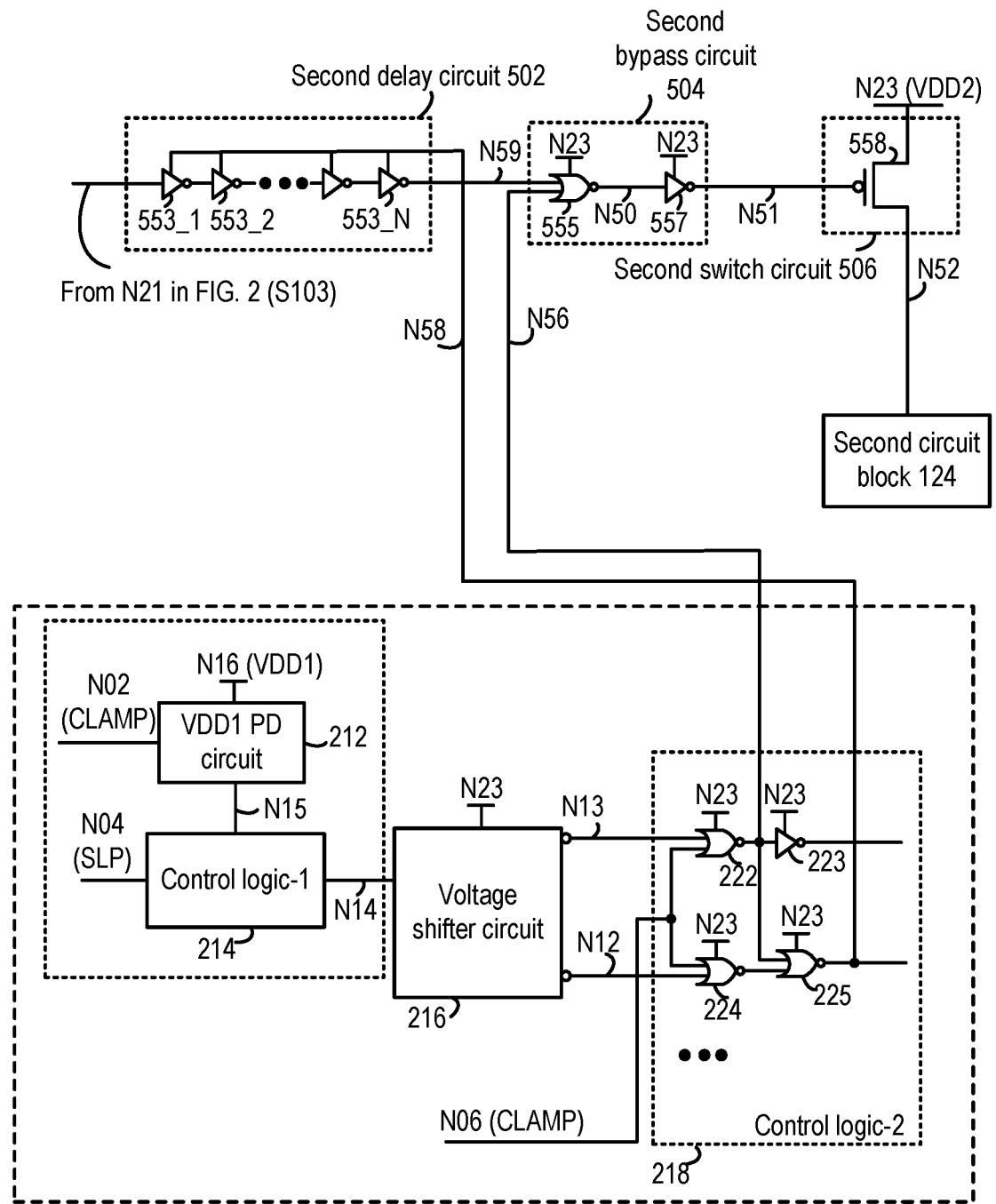
FIG. 5 illustrates example circuits of the next stage power supply circuit 104 of FIG. 1, in accordance with certain aspects of the present disclosure.

FIG. 5 illustrates example circuits of the next stage power supply circuit 104 of FIG. 1, in accordance with certain aspects of the present disclosure. Referring to FIG. 1, the next stage power supply circuit 104 may be configured to power the second circuit block 124, conditioned by signaling S103 from the power supply circuit 102. In some examples, the power supply circuit 102 powering the circuit block 122 and the next stage power supply circuit 104 powering the second circuit block 124 may be configured to be staggered, in accordance with signaling from the control circuit 111. For example, the power supply circuit 102 may be configured to power up the circuit block 122 first, followed by the next stage power supply circuit 104 powering up the second circuit block 124. In some examples, the control circuit 111 may be configured to turn off the power supply circuit 102 powering the circuit block 122 and the next stage power supply circuit 104 powering the second circuit block 124 in parallel.

FIG. 5 illustrates the next stage power supply circuit 104, the second circuit block 124, and the control circuit 111. In some examples, the next stage power supply circuit 104 may be an instance of the power supply circuit 102, and description related to the power supply circuit 102 may be applicable to the next stage power supply circuit 104. The second circuit block 124 may be an instance of the circuit block 122, and description related to the circuit block 122 may be applicable to the second circuit block 124. FIG. 5 illustrates that the next stage power supply circuit 104 may include a second delay circuit 502, a second bypass circuit 504, and/or a second switch circuit 506.

The second switch circuit 506 may be configured to power the second circuit block 124. As illustrated, the second switch circuit 506 may include a p-type transistor 558. The p-type transistor 558 may be configured to have a source coupled to a node N23 and a drain coupled to a node N52 and via the node N52, to the second circuit block 124. The p-type transistor 558 may be configured to receive power via the node N23 and to power the second circuit block 124 via the node N52. The p-type transistor 558 may further be configured to have a gate coupled to a node N51. The p-type transistor 558 (thus second switch circuit 506) may be configured to turned ON (or OFF) to power (or to not power) the second circuit block 124 based on signaling on the node N51.

The second bypass circuit 504 may be configured to drive the second switch circuit 506 to enable and to disable the second switch circuit 506 to power the second circuit block 124. As illustrated, the second bypass circuit 504 includes a NOR gate 555 and an inverter 557 arranged in series, via a node N50. The NOR gate 525 may be configured to receive inputs via nodes N59 and N56 and output via the node N50. The inverter 557 may be configured to receive input from the node N50 and output to the second switch circuit 506 via the node N51. For example, the second bypass circuit 504 may be configured to, via the inverter 557, drive the gate of the p-type transistor 558 of the second switch circuit 506 to turn the p-type transistor 558 ON and OFF, thereby to enable and to disable the second switch circuit 506 powering the second circuit block 124.

The second delay circuit 502 may be configured to delay the second bypass circuit 504 driving the second switch circuit 506. As illustrated, the second delay circuit 502 includes N stages of inverters 553_1 to 553_N arranged in series. For example, an output of the inverter 553_1 may be provided as an input to the inverter 553_2, and so forth. The inverters 553_1 to 553_N may be configured to be powered via a node N58. The second delay circuit 502 may be configured to receive signaling via a node N21 (see FIG. 2, the signaling may include S103 of FIG. 1), delay the received signaling, and output the delayed signaling to the second bypass circuit 504 via the node N59.

As presented with the power supply circuit 102 of FIG. 1, the second switch circuit 506 may be configured to power the second circuit block 124. The second bypass circuit 504 may be configured to drive the second switch circuit 506 to enable and to disable the second switch circuit 506 powering the second circuit block 124, based on the control signal SLP and the control signal CLAMP. For example, the control circuit 111 may be configured to, based on the control signal CLAMP, cause the second bypass circuit 504 to drive the second switch circuit 506 to disable the second switch circuit 506 powering the second circuit block 124, bypassing the second delay circuit 502. For example, the control circuit 111 may be configured to output logic zero (e.g., ground) on the node N58 and logic one (e.g., supply voltage VDD2) on the node N56, in response to the control signal CLAMP being at logic one (e.g., supply voltage VDD2). The node N58 being at logic zero powers down the second delay circuit 502, reducing leakage current while the next stage power supply circuit 104 is in a standby mode (e.g., inactive or unresponsive to certain control signals). The node N56 being at logic one causes the second bypass circuit 504 to output logic one on the node N51 and disables the second switch circuit 506 powering the second circuit block 124.

Moreover, the second delay circuit 502 may be configured to delay signaling to the second bypass circuit 504, the signaling being based on the control signal SLP. For example, the second delay circuit 502 may be configured to receive signaling on the node N21 from the power supply circuit 102 (see FIG. 2), and to delay the received signaling via the N stages of inverters 553_1 to 553_N. As presented with the power supply circuit 102 of FIG. 2, the signaling on the node N21 being based on (e.g., controlled by) the control signal SLP. The second delay circuit 502 may be further configured to output the delayed signaling to the second bypass circuit 504 (via the node N59) and the second switch circuit 506 (via the node N51). In such fashion, the control circuit 111 may be further configured to, based on the control signal SLP and via the second delay circuit 502 and the second bypass circuit 504, enable and disable the second switch circuit 506 powering the second circuit block 124.

Moreover, the second bypass circuit 504 may be further configured to drive the second switch circuit 506 to enable the second switch circuit 506 powering the second circuit block 124, conditioned by the bypass circuit 204 driving the switch circuit 206 to enable the switch circuit 206 powering the circuit block 122. For example, referring to FIG. 2, the bypass circuit 204 may be configured to output logic zero onto the node N21 to enable the switch circuit 206 powering the circuit block 122. The second delay circuit 502 may be configured to receive logic zero on the node N21, delay the signaling, and provide logic zero on the node N59 to the second bypass circuit 504. In response, the second bypass circuit 504 may be configured to output logic zero to the second switch circuit 506, via the node N51, enabling the second switch circuit 506 to power the second switch circuit 506.

As presented above, the second delay circuit 502 may be configured to delay enabling the second switch circuit 506 powering the second circuit block 124 conditioned on the switch circuit 206 powering the circuit block 122. For example, second delay circuit 502 may be configured to receive signaling on N21 (from FIG. 2) and based upon which delay outputting onto the node N59. The second bypass circuit 504 may be configured to enabling the second switch circuit 506 powering the second circuit block 124 in response to signaling received on the node N59. The second delay circuit 502 may be further configured to be powered down, e.g., via the node N58. For example, the second delay circuit 502 may be configured to be powered, and therefore powered down, via the node N58. The second bypass circuit 504 may be further configured to bypass the second delay circuit 502 to disable the second switch circuit 506 powering the second circuit block 124. For example, the second bypass circuit 504 may be configured disable the second switch circuit 506 powering the second circuit block 124 independent of signaling on the node N59 (and therefore the second delay circuit 502), in response to logic one on the node N56.

Figure 6:
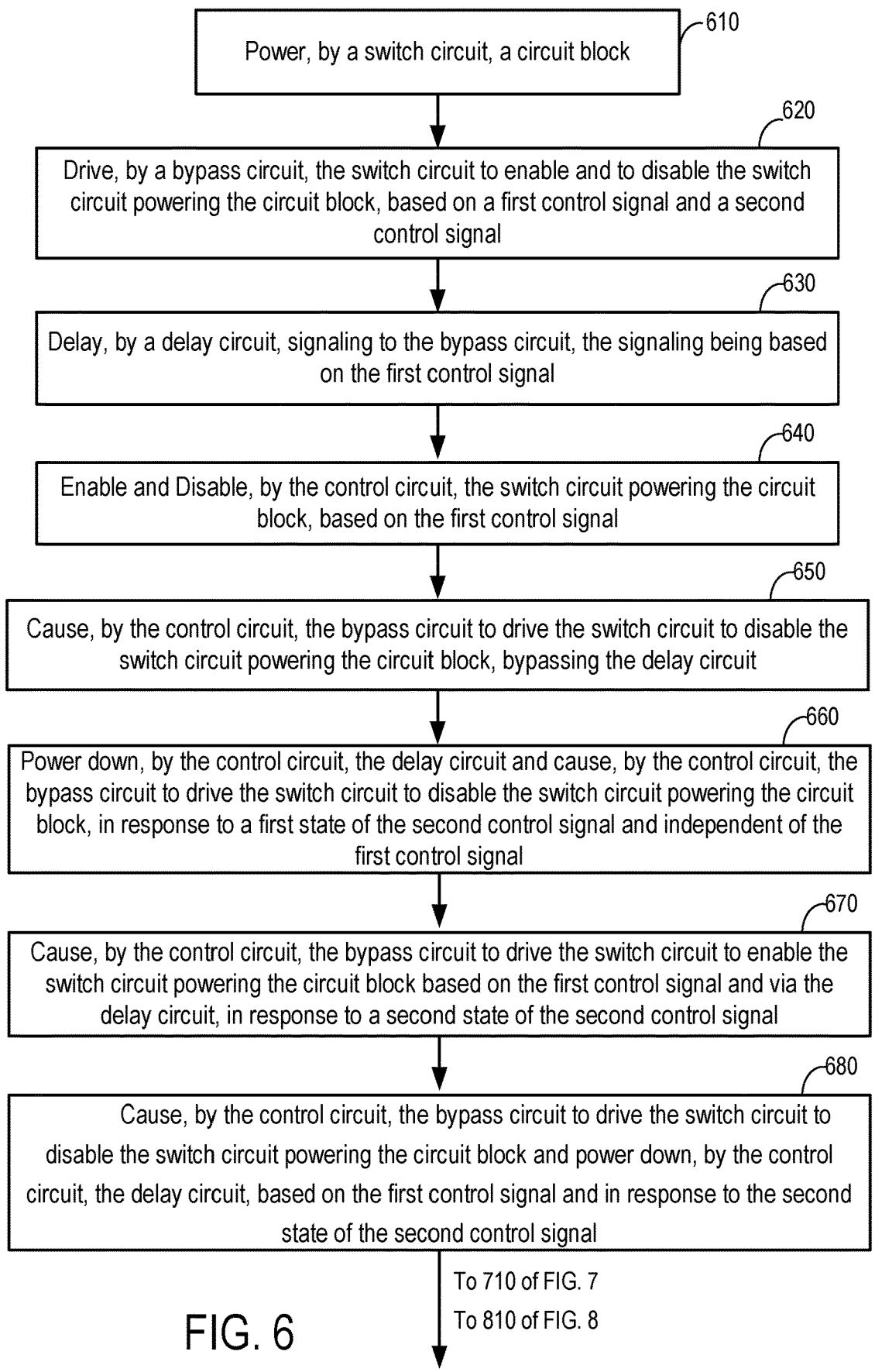
FIG. 6 illustrates portions of a method to reduce leakage current in powering a circuit block, in accordance with certain aspects of the disclosure.
Figure 7:
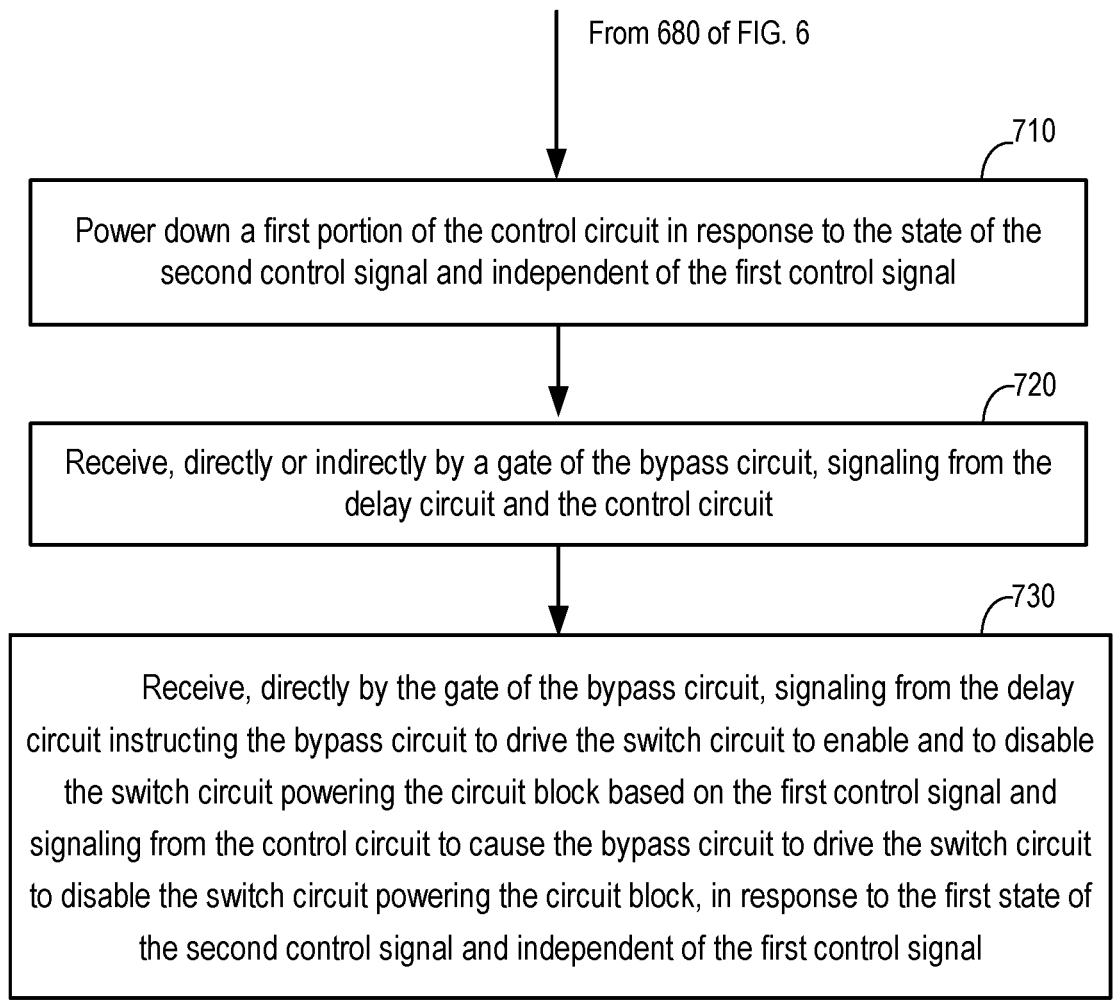
FIG. 7 illustrates additional portions of the method to reduce leakage current in powering a circuit block, in accordance with certain aspects of the disclosure.
Figure 8:
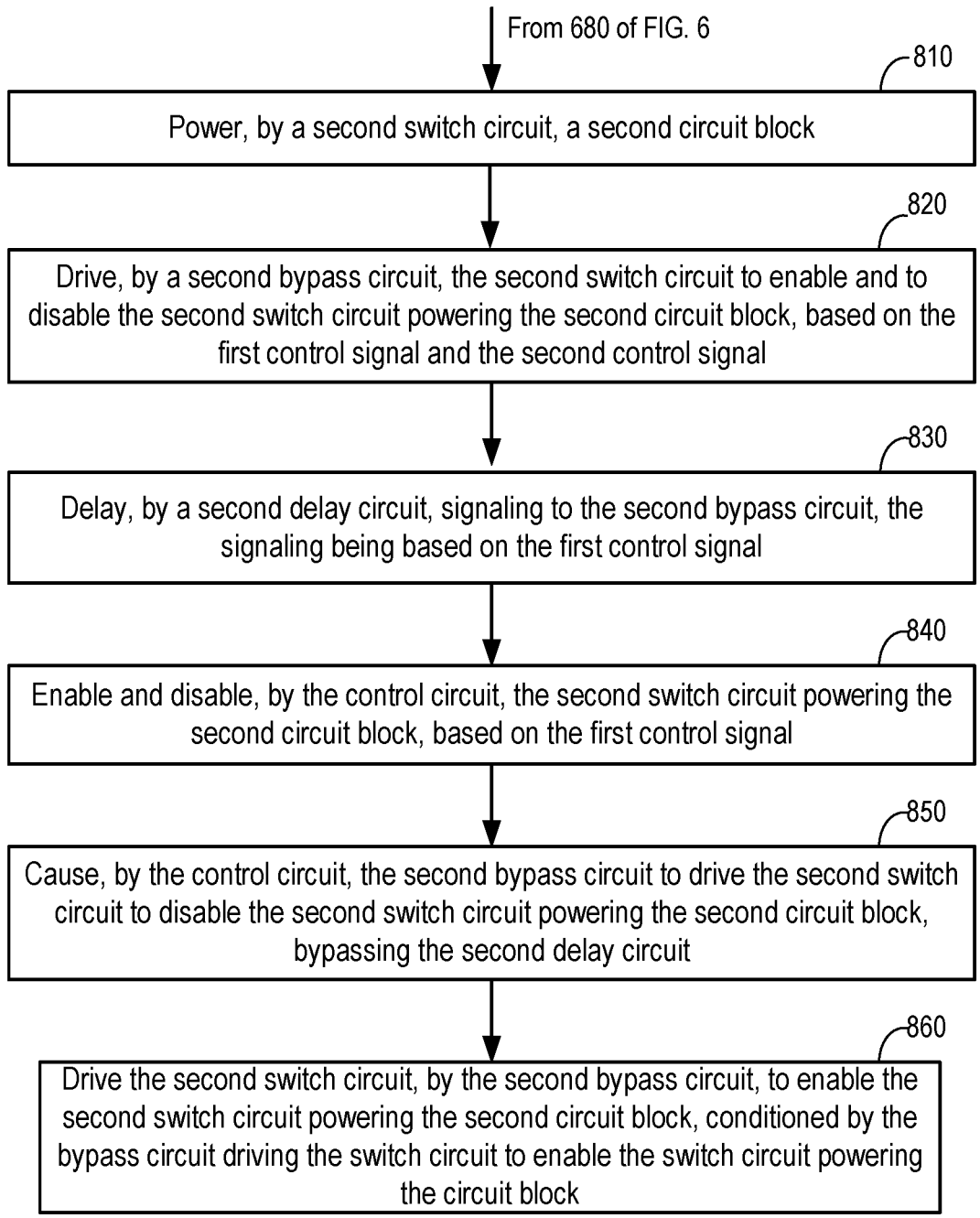
FIG. 8 illustrates additional portions the method to reduce leakage current in powering a circuit block, in accordance with certain aspects of the disclosure.

FIGS. 6-8 illustrate portions of a method to reduce leakage current in powering a circuit block (e.g., the circuit block 122 or the second circuit block 124), in accordance with certain aspects of the disclosure. The operations of FIGS. 6-8 may be implemented by, for example, the apparatus 100 presented with FIGS. 1-5. The arrows indicate certain relationships among the operations, but not necessarily sequential relationships. At 610, a circuit block is powered by a switch circuit. For example, referring to FIG. 2, the switch circuit 206 includes the p-type transistor 258. The bypass circuit 204 turns on the p-type transistor 258, via the node N21, to provide the supply voltage VDD2 on the node N23 to the switch circuit 206.

At 620, the switch circuit is driven by a bypass circuit to enable and to disable the switch circuit powering the circuit block, based on a first control signal and a second control signal. For example, referring to FIG. 2, the bypass circuit 204 drives the switch circuit 206 via the node N21 to turn the p-type transistor 258 on and off. The bypass circuit 204 includes the NOR gate 255 receiving inputs from nodes N16 and N19, the inputs on N16 and N19 being based on the control signal SLP and the control signal CLAMP. For example, the control circuit 111, based on the control signal SLP and the control signal CLAMP outputs to the NOR gate 255 via the node N16 and via the node N19 (via the delay circuit 202).

At 630, signaling to the bypass circuit is delayed by a delay circuit, the signaling being based on the first control signal. For example, the delay circuit 202 delays signaling on the node N17 and provide the delayed signaling to the bypass circuit 204 via the node N19. At 640, the switch circuit powering the circuit block is enabled and disabled by the control circuit, based on the first control signal. For example, while the control signal CLAMP is at logic zero, the control circuit 111 outputs onto the node N17 based on the control signal SLP (see FIG. 2). For example, in response to the control signal SLP at logic zero (and the control signal CLAMP at logic zero), the control circuit 111 outputs logic one onto node N17. In response to the control signal SLP at logic one (and the control signal CLAMP at logic zero), the control circuit 111 outputs logic zero onto node N17. The bypass circuit 204 drives the switch circuit 206 to enable the switch circuit 206 powering the circuit block 122, in response to the node N17 at logic zero. The bypass circuit 204 drives the switch circuit 206 to disable the switch circuit 206 powering the circuit block 122, in response to the node N17 at logic one.

At 650, the bypass circuit is caused by the control circuit to drive the switch circuit to disable the switch circuit powering the circuit block, bypassing the delay circuit. At 660, the delay circuit is powered down by the control circuit and the bypass circuit is caused by the control circuit to drive the switch circuit to disable the switch circuit powering the circuit block, in response to a first state of the second control signal and independent of the first control signal. For example, in response to the control signal CLAMP at logic one, the control circuit 111 outputs logic one onto the node N16, forcing the bypass circuit 204 to output logic one onto the node N21 (see FIG. 2). In response, the switch circuit 206 powering the circuit block 122 is disabled independent of signaling on the node N19, bypassing the delay circuit 202. Further, in response to the control signal CLAMP at logic one, the control circuit 111 outputs logic zero onto the node N18 to power down the delay circuit 202.

At 670, the bypass circuit is caused by the control circuit to drive the switch circuit to enable the switch circuit powering the circuit block based on the first control signal and via the delay circuit, in response to a second state of the second control signal. For example, in response to the control signal CLAMP at logic zero, the control circuit 111 outputs at the node N16 logic zero to enable the bypass circuit 204 to operate based on signaling on the node N19 (see FIG. 2). With the control signal SLP at logic one, the control circuit 111 outputs logic one on the node N18 to power on the delay circuit 202, and control circuit 111 outputs logic zero on the node N17. The delay circuit 202 delays signaling on the node N17 and outputs logic zero on the node N19 to the bypass circuit 204. In response, the bypass circuit 204 drives the switch circuit 206, via the node N21, to enable the switch circuit 206 powering the circuit block 122. By powering on the delay circuit, and enabling the switch circuit 206 powering the circuit block via the delay circuit, the delay circuit and the switch circuit are powered on in a staggered fashion, thereby reducing a peak of an inrush current.

At 680, the bypass circuit is caused by the control circuit to drive the switch circuit to disable the switch circuit powering the circuit block and the delay circuit is caused by the control circuit to power down, based on the first control signal and in response to the second state of the second control signal. For example, in response to the control signal CLAMP at logic zero and based on the control signal SLP at logic zero, the control circuit 111 outputs at the node N16 logic one to cause the bypass circuit 204 to output logic one on the node N21 (see FIG. 2). The node N21 at logic one turns OFF the switch circuit 206 and therefore, the bypass circuit 204 drives the switch circuit 206 to disable the switch circuit 206 powering the circuit block 122. Moreover, with the control signal CLAMP at logic zero and the control signal SLP at logic zero, the control circuit 111 outputs logic zero on the node N18, powering down the delay circuit 202. In sum, responsive to the control signal CLAMP at logic zero, the bypass circuit 204 driving the switch circuit 206 to disable the switch circuit 206 powering the circuit block 122 and the delay circuit powering down are based on the control signal SLP at logic zero.

At 710, a first portion of the control circuit is powered down in response to the state of the second control signal and independent of the first control signal. For example, referring to FIG. 2, the control circuit 111 includes the control logic-1 214 (e.g., the first portion). The power-down circuit 212 provides power of VDD1 from the node N16 to the control logic-1 214, via the node N15. In response to the control signal CLAMP at logic one, the power-down circuit 212 turns off power to the control logic-1 214, powering down the control logic-1 214. For example, the power-down circuit 212 may include a p-type transistor controlled by the control signal CLAMP.

At 720, signaling from the delay circuit and the control circuit is received, directly or indirectly by a gate of the bypass circuit. At 730, signaling from the delay circuit instructing the bypass circuit to drive the switch circuit to enable and to disable the switch circuit powering the circuit block based on the first control signal and signaling from the control circuit causing the bypass circuit to drive the switch circuit to disable the switch circuit powering the circuit block, in response to the first state of the second control signal and independent of the first control signal are received directly by the gate of the bypass circuit. For example, see FIG. 2, the bypass circuit 204 includes the NOR gate 255 receiving signaling from the delay circuit 202 on the node N19 and receiving signaling from the control circuit 111 on the node N16. In other examples, examples, the NOR gate 255 may receive signaling on the nodes N16 and N19 via intervening circuits (not shown). As presented with 710, signaling on the node N19, from the delay circuit 202, instructs the bypass circuit 204 to drive the switch circuit 206 to enable and to disable the switch circuit 206 powering the circuit block 122 based on the control signal SLP. As presented with 660, signaling on the node N16 from the control circuit 111 causing the bypass circuit 204 to drive the switch circuit 206 to disable the switch circuit 206 powering the circuit block, in response to logic one of the control signal CLAMP and independent of the control signal SLP.

At 810 (e.g., following operation 670), a second circuit block is powered by a second switch circuit. For example, referring to FIG. 5, the second switch circuit 506 powers the second circuit block 124. At 820, the second switch circuit is driven by a second bypass circuit to enable and to disable the second switch circuit powering the second circuit block, based on the first control signal and the second control signal. For example, referring to FIG. 5, the second bypass circuit 504 drives the second switch circuit 506 via the node N51 to turn the p-type transistor 558 on and off. The second bypass circuit 504 includes the NOR gate 555 receiving inputs from nodes N56 and N59 (e.g., respectively the first input and the second input of the second bypass circuit 504), the inputs on N56 and N59 being based on the control signal SLP and the control signal CLAMP. For example, the control circuit 111, based on the control signal SLP and the control signal CLAMP outputs to the NOR gate 555 via the node N56 and via the node N59 (via the second delay circuit 502).

At 830, signaling is delayed by a second delay circuit to the second bypass circuit, the signaling being based on the output of the bypass circuit. For example, the second delay circuit 502 delays signaling on the node N21 and provide the delayed signaling to the second bypass circuit 504 via the node N59. At 840, the second switch circuit powering the second circuit block is enabled and disabled the control circuit, based on the first control signal. For example, while the control signal CLAMP is at logic zero, the control circuit 111 outputs onto the node N21 based on the control signal SLP (see FIG. 5). For example, in response to the control signal SLP at logic zero (and the control signal CLAMP at logic zero), the control circuit 111 outputs logic one onto the node N21. In response to the control signal SLP at logic one (and the control signal CLAMP at logic zero), the control circuit 111 outputs logic zero onto node N21. The second bypass circuit 504 drives the second switch circuit 506 to enable the second switch circuit 506 powering the second circuit block 124, in response to the node N21 at logic zero. The second bypass circuit 504 drives the second switch circuit 506 to disable the second switch circuit 506 powering the second circuit block 124, in response to the node N21 at logic one.

At 850, the second bypass circuit is caused by the control circuit to drive the second switch circuit to disable the second switch circuit powering the second circuit block, bypassing the second delay circuit. For example, in response to the control signal CLAMP at logic one, the control circuit 111 outputs logic one onto the node N56, forcing the second bypass circuit 504 to output logic one onto the node N51 (see FIG. 5). In response, the second switch circuit 506 powering the second circuit block 124 is disabled independent of signaling on the node N59, bypassing the second delay circuit 502. Further, in response to the control signal CLAMP at logic one, the control circuit 111 outputs logic zero onto the node N58 to power down the second delay circuit 502.

At 860, the second switch circuit is driven, by the second bypass circuit, to enable the second switch circuit powering the second circuit block, conditioned by the bypass circuit driving the switch circuit to enable the switch circuit powering the circuit block. For example, the bypass circuit 204 driving the switch circuit 206 to enable the switch circuit 206 powering the circuit block 122 by outputting logic zero on the node N21 (see FIG. 2). In FIG. 5, the second delay circuit 502 receive signaling on N21 (from FIG. 2) and based upon which delay outputting onto the node N59. In response to the node N59 (and the node N21) being at logic zero, the second delay circuit 502 drives the second switch circuit 506 to enable the second switch circuit 506 powering the second circuit block powering the second circuit block 124.

Figure 9:
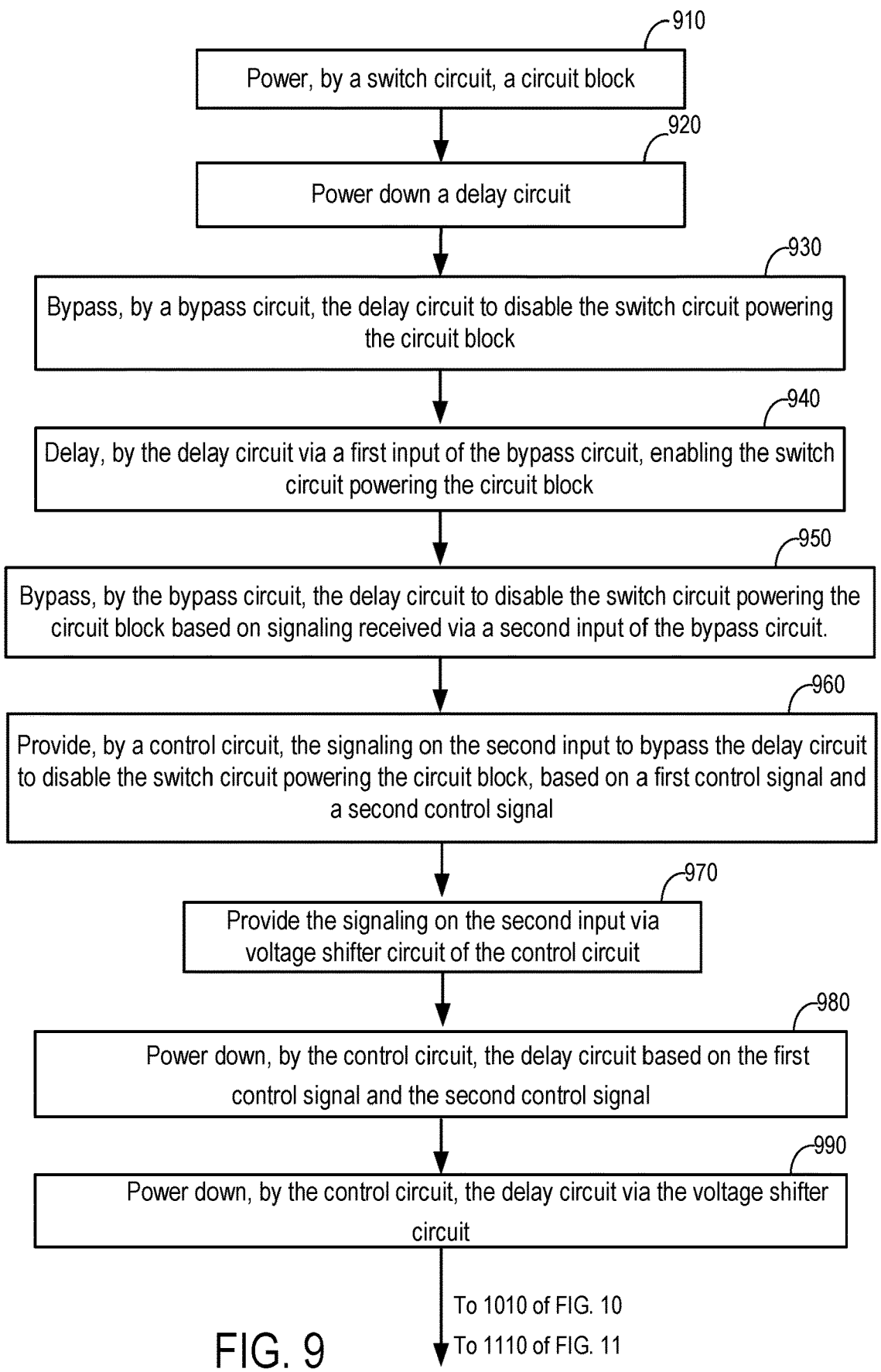
FIG. 9 illustrates portions of another method to reduce leakage current in powering a circuit block, in accordance with certain aspects of the disclosure.
Figure 10:
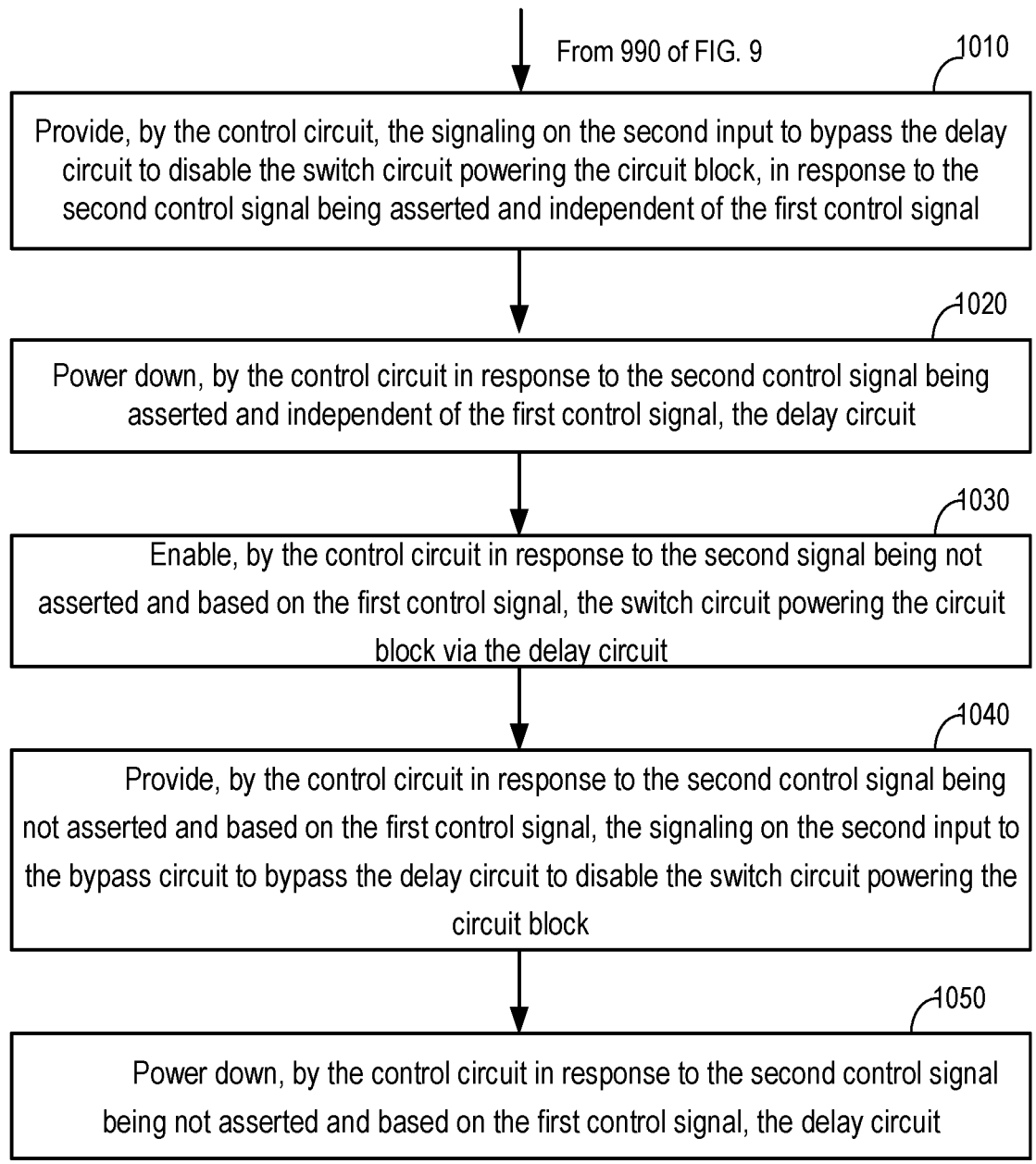
FIG. 10 illustrates additional portions of the another method to reduce leakage current in powering a circuit block, in accordance with certain aspects of the disclosure.
Figure 11:
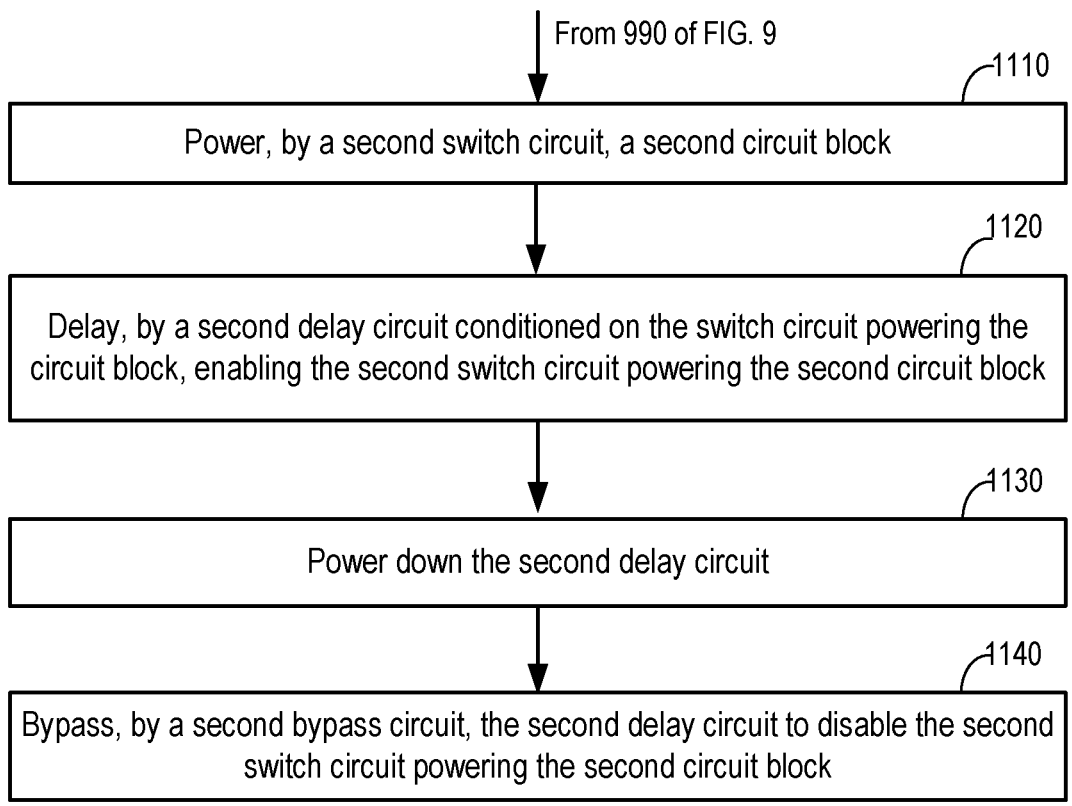
FIG. 11 illustrates additional portions the another method to reduce leakage current in powering a circuit block, in accordance with certain aspects of the disclosure.

FIGS. 9-11 illustrate portions of another method to reduce leakage current in powering a circuit block (e.g., the circuit block 122 or the second circuit block 124), in accordance with certain aspects of the disclosure. The operations of FIGS. 9-11 may be implemented by, for example, the apparatus 100 presented with FIGS. 1-5. The arrows indicate certain relationships among the operations, but not necessarily sequential relationships. At 910, a circuit block is powered by a switch circuit. For example, referring to FIG. 2, the switch circuit 206 includes the p-type transistor 258. The bypass circuit 204 turns on the p-type transistor 258, via the node N21, to provide the supply voltage VDD2 on the node N23 to the switch circuit 206.

At 920, a delay circuit is powered down. At 980, the delay circuit is powered down by the control circuit, based on the first control signal and the second control signal. At 990, the delay circuit is powered down by the control circuit via a voltage shifter circuit. For example, referring to FIG. 2, the control signal CLAMP (e.g., the second control signal) being asserted (e.g., to logic one) causes the control circuit 111 to output logic zero onto the node N18, via the NOR gate 222, to power down the delay circuit 202. Further, while the control signal CLAMP is not asserted, the control circuit 111 may power down the delay circuit 202 based on the control signal SLP (e.g., the first control signal). For example, the control signal SLP at logic zero causes the control circuit 111 to output logic zero onto the node N18, via the voltage shifter circuit 216 and the NOR gate 222, to power down the delay circuit 202.

At 930, the delay circuit is bypassed by a bypass circuit to disable the switch circuit powering the circuit block. At 950, the delay circuit is bypassed by the bypass circuit to disable the switch circuit powering the circuit block based on signaling received via a second input of the bypass circuit. At 960, the signaling on the second input is provided by a control circuit to bypass the delay circuit to disable the switch circuit powering the circuit block, based on a first control signal and a second control signal. At 970, the signaling on the second input is provided via the voltage shifter circuit of the control circuit. For example, referring to FIG. 2, the control signal CLAMP (e.g., the second control signal) being asserted (e.g., to logic one) causes the control circuit 111 to output logic one onto the node N16 (e.g., the second input of the bypass circuit 204), via the gates 224 and 225. In response to logic one on the node N16, the bypass circuit 204 bypasses (e.g., to operate regardless or independent of) the delay circuit 202 and to disable the switch circuit 206 powering the circuit block 122 by outputting logic one onto the node N21. Further, while the control signal CLAMP is not asserted, the control circuit 111 may output logic one onto the node N16 based on the control signal SLP (e.g., the first control signal). For example, the control signal SLP at logic zero causes the control circuit 111 to output logic one onto the node N16, via the voltage shifter circuit 216 and gates 224 and 225, to bypass the delay circuit 202 while disabling the switch circuit 206 powering the circuit block 122.

At 940, enabling the switch circuit powering the circuit block is delayed by the delay circuit via a first input of the bypass circuit. For example, while the control signal CLAMP is de-asserted (e.g., as logic zero), the control circuit 111 delays the switch circuit 206 powering the circuit block 122 via the delay circuit 202 and the node N19 (e.g., the first input of the bypass circuit 204). For example, the control signal SLP at logic one causes the control circuit 111 to output logic zero at the node N17, via the voltage shifter circuit 216 and the gates 222 and 223. The delay circuit 202 delays from the node N17 and then outputs logic zero onto the node N19 (the first input). The switch circuit 206 is thus enabled to power the circuit block 112.

At 1010 (e.g., following 990 of FIG. 9), signaling on the second input to bypass the delay circuit to disable the switch circuit powering the circuit block is provided by the control circuit, in response to the second control signal being asserted and independent of the first control signal. At 1020, the delay circuit is powered down by the control circuit in response to the second control signal being asserted and independent of the first control signal. For example, the control signal CLAMP (e.g., the second control signal) being asserted (e.g., to logic one) causes the control circuit 111 to output logic one onto the node N16 (e.g., the second input of the bypass circuit 204), via the gates 224 and 225. In response to logic one on the node N16, the bypass circuit 204 bypasses (e.g., to operate regardless or independent of) the delay circuit 202 and to disable the switch circuit 206 powering the circuit block 122 by outputting logic one onto the node N21. Further, referring to FIG. 2, the control signal CLAMP (e.g., the second control signal) being asserted (e.g., to logic one) causes the control circuit 111 to output logic zero onto the node N18, via the NOR gate 222, to power down the delay circuit 202 independent of the control signal SLP.

At 1030, the switch circuit powering the circuit block via the delay circuit is enabled by the control circuit in response to the second signal being not asserted and based on the first control signal. For example, referring to FIG. 2, the control signal CLAMP being not asserted allows the control circuit to respond to the control signal SLP to, for example, enable the switch circuit 206 powering the circuit block 122 via the delay circuit 202. For example, while the control signal CLAMP is not asserted, the control circuit 111 may output logic one onto the node N16 based on the control signal SLP (e.g., the first control signal). While the control signal CLAMP is de-asserted (e.g., as logic zero), the control circuit 111 delays the switch circuit 206 powering the circuit block 122 via the delay circuit 202 and the node N19 (e.g., the first input of the bypass circuit 204). For example, the control signal SLP at logic one causes the control circuit 111 to output logic zero at the node N17, via the voltage shifter circuit 216 and the gates 222 and 223. The delay circuit 202 delays from the node N17 and then outputs logic zero onto the node N19 (the first input). The switch circuit 206 is thus enabled to power the circuit block 112.

At 1040, the signaling on the second input to the bypass circuit to bypass the delay circuit to disable the switch circuit powering the circuit block is provided by the control circuit in response to the second control signal being not asserted and based on the first control signal. For example, while the control signal CLAMP is not asserted, the control circuit 111 may output logic one onto the node N16 based on the control signal SLP (e.g., the first control signal). For example, the control signal SLP at logic zero causes the control circuit 111 to output logic one onto the node N16, via the voltage shifter circuit 216 and gates 224 and 225, to bypass the delay circuit 202 while disabling the switch circuit 206 powering the circuit block 122.

At 1050, the second delay circuit is powered down by the control circuit in response to the second control signal being not asserted and based on the first control signal. For example, while the control signal CLAMP is not asserted, the control circuit 111 may power down the delay circuit 202 based on the control signal SLP (e.g., the first control signal). For example, the control signal SLP at logic zero causes the control circuit 111 to output logic zero onto the node N18, via the voltage shifter circuit 216 and the NOR gate 222, to power down the delay circuit 202.

At 1110 (e.g., following 990 of FIG. 9), a second circuit block is powered by a second switch circuit. For example, referring to FIG. 5, the second switch circuit 506 includes the p-type transistor 558. The second bypass circuit 504 turns on the p-type transistor 558, via the node N51, to provide the supply voltage VDD2 on the node N23 to the second switch circuit 506. At 1120, enabling the second switch circuit powering the second circuit block is delayed by a second delay circuit conditioned on the switch circuit powering the circuit block. For example, referring to FIG. 5, the second delay circuit 502 delays enabling the second switch circuit 506 powering the second circuit block 124 conditioned on the switch circuit 206 powering the circuit block 122. For example, second delay circuit 502 receives signaling on N21 (from FIG. 2) and based upon which delay outputting onto the node N59. The second bypass circuit 504 enables the second switch circuit 506 powering the second circuit block 124 in response to signaling received on the node N59.

At 1130, a second delay circuit is powered down. For example, referring to FIG. 5, the control signal CLAMP (e.g., the second control signal) being asserted (e.g., to logic one) causes the control circuit 111 to output logic zero onto the node N58, via the NOR gate 222, to power down the second delay circuit 502. At 1140, the second delay circuit is bypassed by a second bypass circuit to disable the second switch circuit powering the second circuit block. For example, referring to FIG. 5, the control signal CLAMP (e.g., the second control signal) being asserted (e.g., to logic one) causes the control circuit 111 to output logic one onto the node N56 (e.g., the second input of the second bypass circuit 504), via the NOR gate 222. In response to logic one on the node N56, the second bypass circuit 504 bypasses (e.g., to operate regardless or independent of) the second delay circuit 502 and to disable the second switch circuit 506 powering the second circuit block 124 by outputting logic one onto the node N51.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An apparatus, comprising:
a switch circuit configured to power a circuit block;
a delay circuit configured
   to delay enabling the switch circuit powering the circuit block and
   to be powered down;
a bypass circuit configured to bypass the delay circuit to disable the switch circuit powering the circuit block, the bypass circuit comprising a first input and a second input,
   the delay circuit configured to delay enabling the switch circuit powering the circuit block via the first input, and the bypass circuit further configured to, based on signaling received via the second input, bypass the delay circuit to disable the switch circuit powering the circuit block; and a control circuit configured to, based on a first control signal and a second control signal, provide the signaling to the second input to bypass the delay circuit to disable the switch circuit powering the circuit block, the control circuit comprising a voltage shifter circuit and configured to provide the signaling to the second input via the voltage shifter circuit.

2. The apparatus of claim 1, the bypass circuit comprising a gate coupled to the first input and to the second input.

3. The apparatus of claim 1, the control circuit further configured to power down the delay circuit based on the first control signal and the second control signal.

4. The apparatus of claim 3, the control circuit further comprising a voltage shifter circuit; the control circuit further configured to power down the delay circuit via the voltage shifter circuit.

5. The apparatus of claim 1, the first control signal being in a first voltage domain having a first supply voltage, the second control signal being in a second voltage domain having a second supply voltage different from the first supply voltage.

6. The apparatus of claim 1, the control circuit further configured to provide the signaling to the second input to bypass the delay circuit to disable the switch circuit powering the circuit block, in response to the second control signal being asserted and independent of the first control signal.

7. The apparatus of claim 6, the control circuit further configured to power down the delay circuit, in response to the second control signal being asserted and independent of the first control signal.

8. The apparatus of claim 7, the control circuit further configured to enable the switch circuit powering the circuit block via the delay circuit, in response to the second control signal being not asserted and based on the first control signal.

9. The apparatus of claim 8, the control circuit further configured to provide the signaling on the second input to bypass the delay circuit to disable the switch circuit powering the circuit block and to power down the delay circuit, in response to the second control signal being not asserted and based on the first control signal.

10. The apparatus of claim 6, the first control signal being in a first voltage domain having a first supply voltage, the second control signal being in a second voltage domain having a second supply voltage different from the first supply voltage.

11. The apparatus of claim 10, the second control signal being asserted in response to powering up the second supply voltage.

12. The apparatus of claim 1, comprising:

a second switch circuit configured to power a second circuit block;

a second delay circuit configured
to delay enabling the second switch circuit powering the second circuit block conditioned on the switch circuit powering the circuit block and
to be powered down;

a second bypass circuit configured to bypass the second delay circuit to disable the second switch circuit powering the second circuit block.

13. The apparatus of claim 1, comprising a device selected from one of a computing system, a mobile computing system, an Internet of Things device, a virtual reality system, or an augmented reality system, the device incorporating the switch circuit, the circuit block, the bypass circuit, and the delay circuit.

14. A method to reduce leakage current, comprising:
powering, by a switch circuit, a circuit block;
powering down a delay circuit;
bypassing, by a bypass circuit, the delay circuit to disable the switch circuit powering the circuit block;
delaying, by the delay circuit via a first input of the bypass circuit, enabling the switch circuit powering the circuit block;
bypassing, by the bypass circuit, the delay circuit to disable the switch circuit powering the circuit block based on signaling received via a second input of the bypass circuit;
providing, by a control circuit, the signaling on the second input to bypass the delay circuit to disable the switch circuit powering the circuit block, based on a first control signal and a second control signal; and
providing the signaling on the second input via a voltage shifter circuit of the control circuit.

15. The method of claim 14, the bypass circuit comprising a gate coupled to the first input and to the second input.

16. The method of claim 14, further comprising
powering down, by the control circuit, the delay circuit based on the first control signal and the second control signal.

17. The method of claim 16, further comprising
powering down, by the control circuit, the delay circuit via a voltage shifter circuit of the control circuit.

18. The method of claim 14, the first control signal being in a first voltage domain having a first supply voltage, the second control signal being in a second voltage domain having a second supply voltage different from the first supply voltage.

19. The method of claim 14, further comprising
providing, by the control circuit, the signaling on the second input to bypass the delay circuit to disable the switch circuit powering the circuit block, in response to the second control signal being asserted and independent of the first control signal.

20. The method of claim 19, further comprising
powering down, by the control circuit in response to the second control signal being asserted and independent of the first control signal, the delay circuit.

21. The method of claim 20, further comprising
enabling, by the control circuit in response to the second control signal being not asserted and based on the first control signal, the switch circuit powering the circuit block via the delay circuit.

22. The method of claim 21, further comprising
providing, by the control circuit in response to the second control signal being not asserted and based on the first control signal, the signaling on the second input to the bypass circuit to bypass the delay circuit to disable the switch circuit powering the circuit block; and
powering down, by the control circuit in response to the second control signal being not asserted and based on the first control signal, the delay circuit.

23. The method of claim 19, the first control signal being in a first voltage domain having a first supply voltage, the second control signal being in a second voltage domain having a second supply voltage different from the first supply voltage.

24. The method of claim 23, the second control signal being asserted in response to powering up the second supply voltage.

25. The method of claim 14, comprising:
- powering, by a second switch circuit, a second circuit block;
- delaying, by a second delay circuit conditioned on the switch circuit powering the circuit block, enabling the second switch circuit powering the second circuit block;
- powering down the second delay circuit;

bypassing, by a second bypass circuit, the second delay circuit to disable the second switch circuit powering the second circuit block.

\* \* \* \* \*